United States Patent
Lu et al.

(10) Patent No.: US 8,198,923 B2
(45) Date of Patent: Jun. 12, 2012

(54) HARMONIC SUPPRESSION CIRCUIT, AN INJECTION-LOCKED FREQUENCY DIVIDER CIRCUIT AND ASSOCIATED METHODS

(75) Inventors: Shey-Shi Lu, Taipei (TW); Hsien-Ku Chen, Taipei (TW)

(73) Assignee: National Taiwan University, Taipei (TW)

( * ) Notice: Subject to any disclaimer, the term of this patent is extended or adjusted under 35 U.S.C. 154(b) by 453 days.

(21) Appl. No.: 12/165,151

(22) Filed: Jun. 30, 2008

(65) Prior Publication Data

US 2009/0261868 A1 Oct. 22, 2009

(30) Foreign Application Priority Data

Apr. 18, 2008 (TW) ................ 97114357 A

(51) Int. Cl.
H03B 19/06 (2006.01)
(52) U.S. Cl. .......................................... 327/118; 331/45
(58) Field of Classification Search .................. 327/118, 327/113–115, 117, 156–159; 331/1 A, 8, 331/10, 12, 16–18, 25, 36 C, 96, 99–102, 331/117 R, 117 FE, 117 D, 177 R, 177 V, 331/179

See application file for complete search history.

(56) References Cited

U.S. PATENT DOCUMENTS 6,867,656 B2 * 3/2005 Hajimiri et al. ................. 331/45

* cited by examiner

*Primary Examiner* — Lincoln Donovan
*Assistant Examiner* — Diana J Cheng
(74) *Attorney, Agent, or Firm* — Morris Manning & Martin LLP; Tim Tingkang Xia, Esq.

(57) ABSTRACT

The invention includes a harmonic suppression circuit, an injection-locked frequency divider circuit (ILFD) and associated methods. The harmonic suppression circuit comprises a source voltage, two suppression modules, two input terminals, two smoothed output terminals and a ground. The ILFD comprises a ground, an input transistor, an input terminal, two divider legs, two output terminals and a source voltage. The associated method to improve harmonic suppression comprises acts of synthesizing differential-phase signals and simultaneously suppressing second harmonics of in-phase signals. The method to extent an ILFD's locking range comprises acts of decreasing quality factor while keeping resonance frequency constant.

11 Claims, 8 Drawing Sheets

HARMONIC SUPPRESSION CIRCUIT, AN INJECTION-LOCKED FREQUENCY DIVIDER CIRCUIT AND ASSOCIATED METHODS

FIELD OF THE INVENTION

The present invention relates to a harmonic suppression circuit, an injection-locked frequency divider (ILFD) circuit and associated methods, especially to methods to improve harmonic suppression and reduce quality factor ($Q_\alpha$) of the ILFD and keep resonance frequency ($\omega_0$) of the ILFD constant.

DESCRIPTION OF THE RELATED ART

Millimeter wave region of the electromagnetic spectrum is usually considered to be a range of wavelengths from 10 millimeters to 1 millimeter, and radio band frequencies are 30 GHz to 300 GHz. This means they are larger than infrared waves or x-rays, but smaller than radio waves or microwaves, and according to propagation characteristics of the millimeter wave, which is considered with anti-interference, anti-interception and high frequency, therefore, make them useful for a variety of applications including transmitting large amounts of computer data, cellular communications, and radar.

To utilize the millimeter wave into a variety of applications, generally applies a phase lock loop system (PLLs) for signal transmission or signal reception. However, the PLLs provide an output signal related to an input signal by a fixed frequency or phase, wherein the output is generated once the frequency of an oscillator of the PLLs matched to both frequency and phase.

The PLLs is compose of a phase/frequency detector (PFD), a charge pump (CP), a loop filter (LF), a voltage controlled oscillator (VCO) and a frequency divider (FD). Since an integrated circuit can provide a complete phase-locked-loop building block, the CMOS millimeters wave technology has attracted much attention because of its potential of lower cost and better integration level than other competitive technologies such as III-V or Bipolar manufacturing processes.

A CMOS injection-locked frequency divider (ILFD) is popularly used in phase-locked loops (PLLs) for frequency division because it consumes less power than a broadband static (or flip-flop based) frequency divider. However, because the frequencies of an input signal for an ILFD is limited to a multiple of the free-running frequency of an oscillator in the ILFD. Range of the input signal is called locking range. If the frequency of the input signal is much higher than the frequency of the oscillator, the ILFD cannot divide the frequency. Therefore, low locking range of an ILFD is often a significant limitation to it use.

A conventional ILFD is formed around an oscillator consisting of multiple inductors (L) and capacitors (C) configured as an LC resonant tank that generates a resonance frequency ($\omega_0$). $\omega_0$ can be represented as follows:

$$\omega_0 = \sqrt{\frac{1}{LC_P} - \frac{R_a^2}{L^2}}$$

$R_\alpha$ is parasitic resistance of the inductance, is $\alpha \times Z_0$ and dominates quality factor ($Q_\alpha$) of the inductance, which affects stability of an ILFD signal and can be derived as follows:

$$Q_\alpha = \frac{1}{\alpha} \cdot \frac{\omega_0 L}{Z_0}.$$

wherein $\alpha = R_\alpha/Z_0$.

With reference to FIG. 1(a) and the definition of the quality factor ($Q_\alpha$) of the ILFD, it is intuitive that the lower the $Q_\alpha$, the poorer the noise.

Some techniques have been proposed to extend locking range of the ILFD, such as a ring-based IFLD that produces a wider locking range by utilizing an inherent self oscillation property of a ring structure. However, it consumes more power than a conventional ILFD. However, another method using a series inductive peaking techniques to enhance a loop gain to increase the locking range has been taught, but a large chip area is required to accommodate use of inductors.

Moreover, a harmonic is a component frequency of a signal that is an integer multiple of a fundamental frequency, and it appears in every electronic application that decomposes the signal. Therefore, every electronic circuit design may come across distortion arising from harmonics.

SUMMARY OF THE INVENTION

The primary objective of the present invention is to reduce harmonics and to extend locking range of an ILFD.

The invention includes a harmonic suppression circuit, an injection-locked frequency divider circuit (ILFD) and associated methods. The harmonic suppression circuit comprises a source voltage, two suppression modules, two input terminals, two smoothed output terminals and a ground. The ILFD comprises a ground, an input transistor, an input terminal, two divider legs, two output terminals and a source voltage. The associated method to improve harmonic suppression comprises acts of synthesizing differential-phase signals and simultaneously suppressing second harmonics of in-phase signals. The method to extent an ILFD's locking range comprises acts of decreasing quality factor while keeping resonance frequency constant.

BRIEF DESCRIPTIONS OF THE DRAWINGS

The features and many of the attendant advantages of this invention will become more apparent by reference to the following detailed description, when taken in conjunction with the accompanying drawings.

DETAILED DESCRIPTIONS OF THE PRESENT INVENTION

The invention comprises a harmonic suppression circuit, an injection-locked frequency divider (ILFD) circuit and associated methods to improve harmonic suppression and extent an ILFD's locking range.

Figure 6:
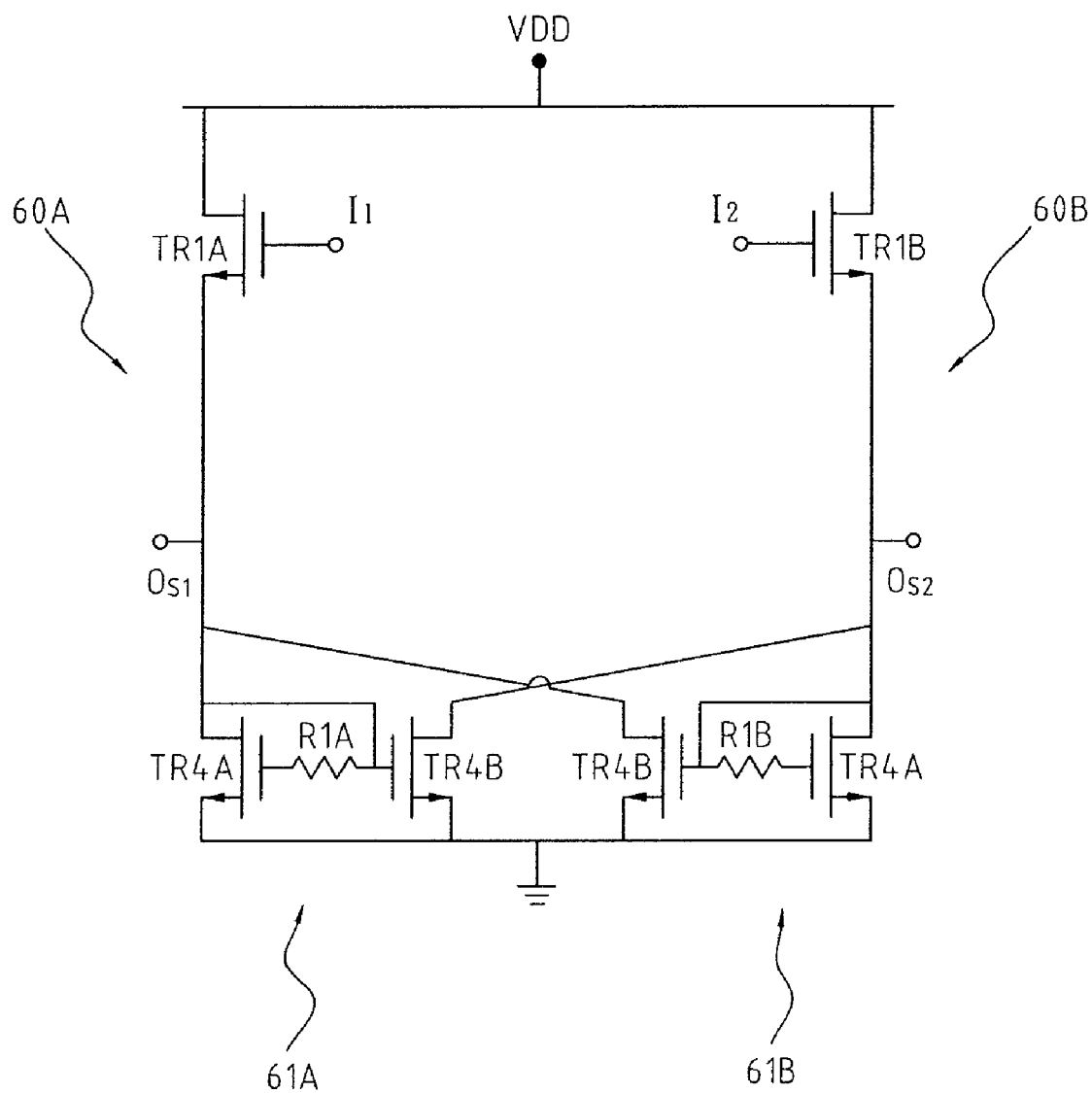
FIG. 6 is a circuit diagram of a harmonic suppression circuit in accordance with the present invention.
Figure 7:
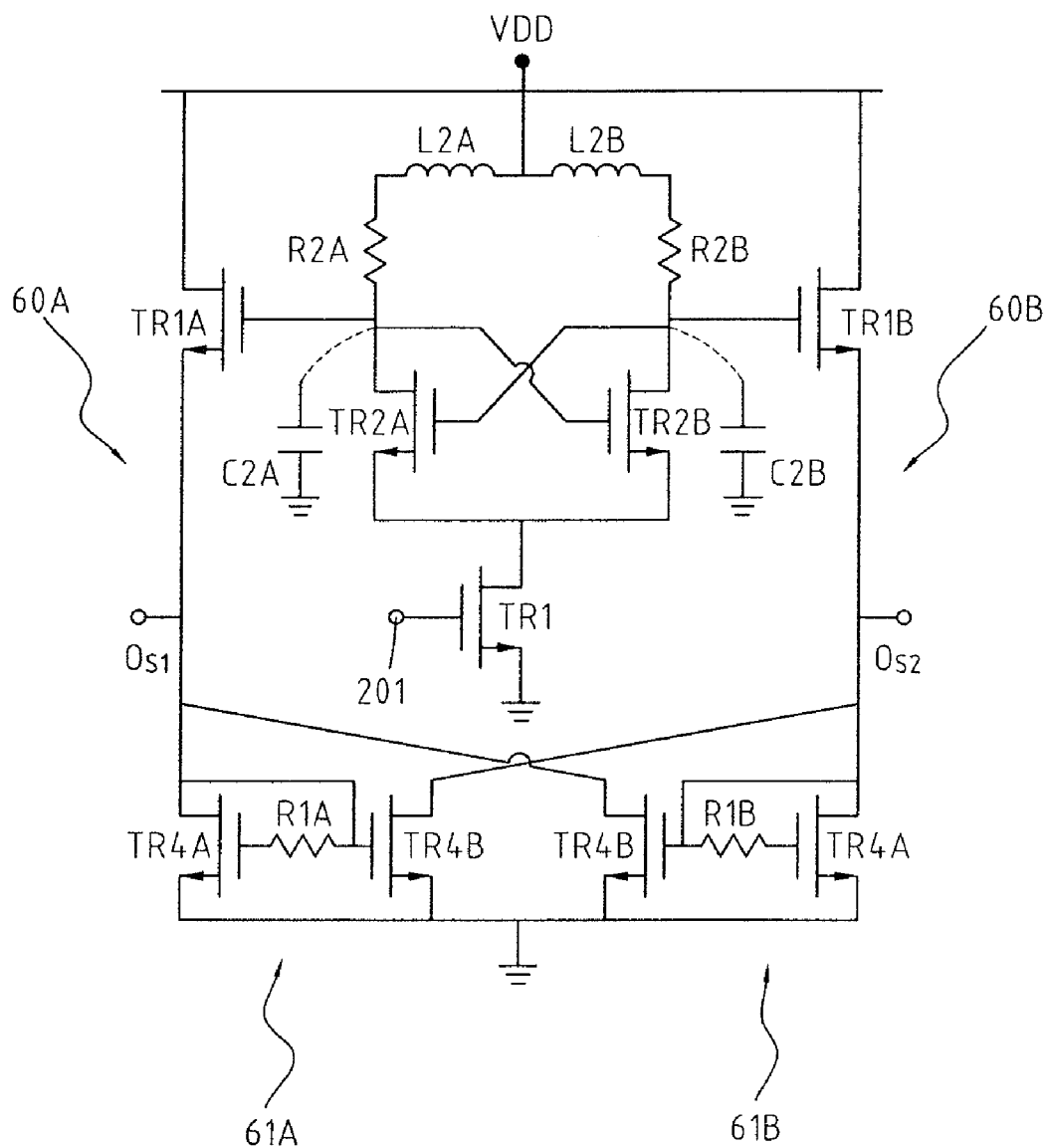
FIG. 7 is a circuit diagram of the divide-by-2 ILFD in FIG. 2 integrated with the harmonic suppression circuit in FIG. 6.

With reference to FIG. 6, a harmonic suppression circuit in accordance with the present invention comprises a source voltage ($V_{DD}$), two suppression modules (60A, 60B), two input terminals ($I_1$, $I_2$), two smoothed output terminals ($O_{s1}$, $O_{s2}$) and a ground.

The suppression modules (60A, 60B) are connected in parallel to the source voltage ($V_{DD}$), and each suppression module (60A, 60B) comprises an input transistor (TR1A, TR1B) and two harmonic suppression modules (61A, 61B).

Each input transistor (TR1A, TR1B) has a drain, a source and a gate. The drain is connected to the source voltage ($V_{DD}$).

The harmonic suppression modules (61A, 61B) are mounted in series respectively with the input transistors (TR1A, TR1B), and each harmonic suppression module (61A, 61B) comprises two smoothing transistors (TR4A, TR4B) and a resistor (R1A, R1B).

The smoothing transistors (TR4A, TR4B) in each harmonic suppression module (61A, 61B) are mounted in parallel, and each smoothing transistor (TR4A, TR4B) has a drain, a gate and a source. The drain of one smoothing transistor (TR4A) is connected to the corresponding transistor (TR1A, TR4B). The drain of the other smoothing transistor (TR4B) is connected to the source of the input transistor (TR4A, TR1B) in the opposite suppression module (60A, 60B).

The resistor (R1A, R1B) is mounted between the gates of the smoothing transistors (TR4A, TR4B) and has two ends. The end of the resistor (R1A, R1B) connected to the smoothing transistor (TR4B) connected to the opposite suppression module (60A, 60B) is connected to the drain of the parallel transistor (TR4A).

The input terminals ($I_1$, $I_2$) are connected respectively to the gates of the input transistors (TR1A, TR1B).

The smoothed output terminals ($O_{s1}$, $O_{s2}$) are connected respectively to the sources of the input transistors (TR1A, TR1B).

The ground is connected to the sources of the smoothing transistors (TR4A, TR4B).

With reference to FIGS. 2, 3, 4 and 7, an ILFD circuit in accordance with the present invention is configured as an LC resonant tank (20, 20a, 20b), has a resonance frequency ($\omega_0$) and a quality factor ($Q_\alpha$), may be a divide-by-2 frequency divider and comprises a ground, an input transistor (TR1), an input terminal (201), two divider legs, two output terminals (206A, 206B), a source voltage (VDD) and an optional harmonic suppression circuit.

The resonance frequency ($\omega_0$) is defined by the following formula $$\omega_0 = \sqrt{\frac{1}{LC_P} - \frac{R_\alpha^2}{L^2}}$$

where $R_\alpha$ is parasitic resistance of the inductance (L).

The quality factor ($Q_\alpha$) is defined by the following formula.

$$Q_\alpha = \frac{1}{\alpha} \cdot \frac{\omega_0 L}{Z_0}$$

wherein $\alpha = R_\alpha/Z_0$ and $Z_0$ is the impedance.

The input transistor (TR1) has a source, a drain and a gate. The source is connected to ground.

The input terminal (201) is connected to the gate of the input transistor (TR1).

The divider legs are connected in parallel, and each divider leg comprises a divider transistor (TR2A, TR2B), an optional differential transistor (TR3A, TR3B), an optional differential input, a parasitic capacitor (C2A, C2B), at least one resistor (R2A, R2B) and at least one inductor (L2A, L2B).

Each divider transistor (TR2A, TR2B) has a source, a drain and a gate. The source is connected to the drain of the input transistor (TR1). The gate is connected to the drain of the divider transistor (TR2A, TR2B) in the other divider leg.

The differential transistor (TR3A, TR3B) is connected to the divider transistor (TR2A, TR2B), may be connected in series or in parallel and has a source, a drain and a gate.

The resistor (R2A, R2B) is connected to the drain of one or both of the transistors (TR2A and TR3A, TR2B and TR3B) and may be a parasitic series resistor, a poly resistor.

The parasitic capacitor (C2A, C2B) is connected to ground and to the dividing leg between the resistor (R2A, R2B) and the transistor (TR2A, TR3A, TR2B, TR3B) or transistors (TR2A and TR3A, TR2B and TR3B).

The inductor (L2A, L2B) has two ends and may be integrated with the resistor (R2A, R2B) where the resistor (R2A, R2B) and inductor (L2A, L2B) are integrated with a routed sheet resistor. One end is connected to the corresponding resistor (R2A, R2B). The other end is connected to the inductor (L2A, L2B) in the other divider leg.

The output terminals (206A, 206B) are connected respectively to the divider legs between the resistor (R2A, R2B) and the corresponding transistors (TR2A and TR3A, TR2B and TR3B) and the gate of the divider transistor (TR2B, TR2A) in the opposite divider leg.

The source voltage (VDD) is connected to the divider legs between the inductors (L2A, L2B).

The harmonic suppression circuit comprises a source voltage ($V_{DD}$), two suppression modules (60A, 60B), two input terminals ($I_1$, $I_2$), two smoothed output terminals ($O_{s1}$, $O_{s2}$) and a ground.

The suppression modules (60A, 60B) are connected in parallel to the source voltage ($V_{DD}$), and each suppression module (60A, 60B) comprises an input transistor (TR1A, TR1B) and two harmonic suppression modules (61A, 61B).

Each input transistor (TR1A, TR1B) has a drain, a source and a gate. The drain is connected to the source voltage ($V_{DD}$).

The harmonic suppression modules (61A, 61B) are mounted in series respectively with the input transistors (TR1A, TR1B), and each harmonic suppression module (61A, 61B) comprises two smoothing transistors (TR2A, TR2B) and a resistor (R1A, R1B).

The smoothing transistors (TR4A, TR4B) in each harmonic suppression module (61A, 61B) are mounted in parallel, and each smoothing transistor (TR4A, TR4B) has a drain, a gate and a source. The drain of one smoothing transistor (TR4A) is connected to the corresponding transistor (TR1A, TR4B). The drain of the other smoothing transistor (TR4B) is connected to the corresponding transistor (TR4A, TR1B) in the opposite suppression module (60A, 60B).

The resistor (R1A, R1B) is mounted between the gates of the smoothing transistors (TR4A, TR4B) and has two ends. The end of the resistor (R1A, R1B) connected to the smoothing transistor (TR4B) connected to the opposite suppression module (60A, 60B) is connected to the drain of the parallel transistor (TR2A, TR2B).

The input terminals ($I_1$, $I_2$) are connected respectively to the gates of the input transistors (TR1A, TR1B).

The smoothed output terminals ($O_{s1}$, $O_{s2}$) are connected respectively to the sources of the input transistors (TR1A, TR1B).

The ground is connected to the sources of the smoothing transistors (TR4A, TR4B).

The method to improve harmonic suppression in accordance with the present invention comprises acts of synthesizing differential-phase signals and simultaneously suppressing second harmonics of in-phase signals.

The act of synthesizing differential-phase signals comprises using amplified input signals to amplify respectively opposite amplified input signals.

The act of suppressing second harmonics of in-phase signals is accomplished by simultaneously applying amplified input signals to gates of smoothing transistors in a corresponding harmonic suppression module through a resistor to the smoothing transistor connected to the amplified input signal.

Figure 5:
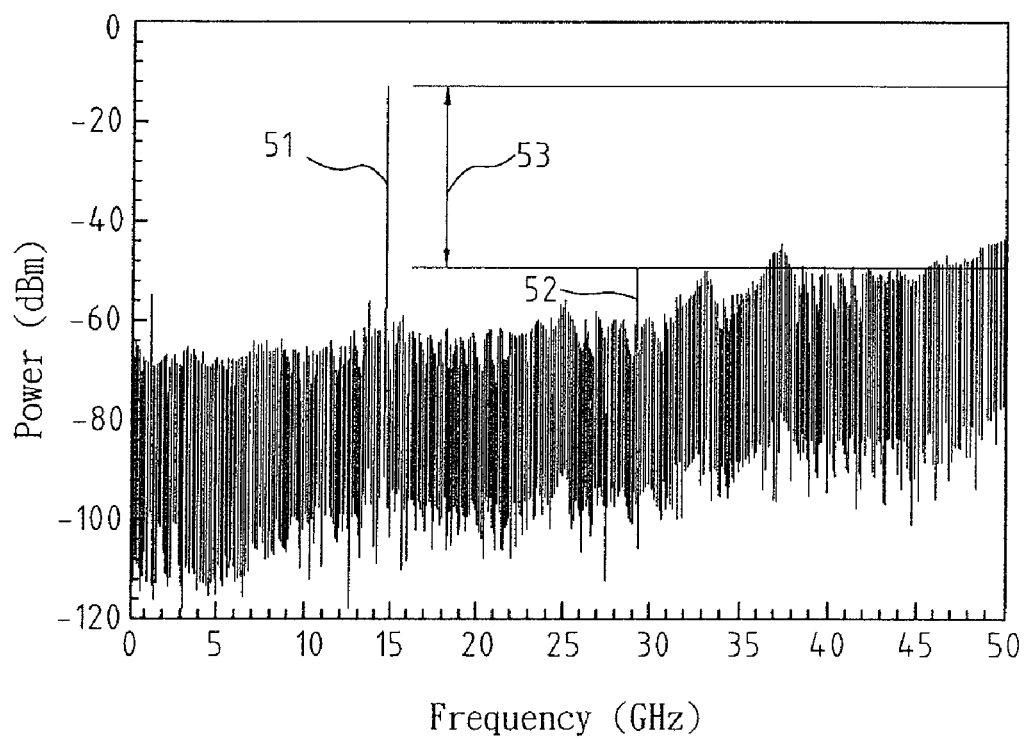
FIG. 5 is a signal spectrum of an output of the present invention under an injection locked condition of harmonic suppression.

With reference to FIG. 5, a simulation to demonstrate power difference between a differential-phase signal (51) and a second harmonic of an in-phase signal (52) shows a 35 dB reduction in the power of the second harmonic of in-phase signals (52) compared to the differential-phase signals (51).

The method to extent an ILFD's locking range in accordance with the present invention comprises acts of decreasing the quality factor ($Q_\alpha$) while keeping the resonance frequency ($\omega_0$) constant.

The act of decreasing the quality factor ($Q_\alpha$) while keeping resonance frequency ($\omega_0$) constant is accomplished by installing resistances respectively in divider legs of an ILFD in series respectively with inductors in the divider legs.

Figure 1A:
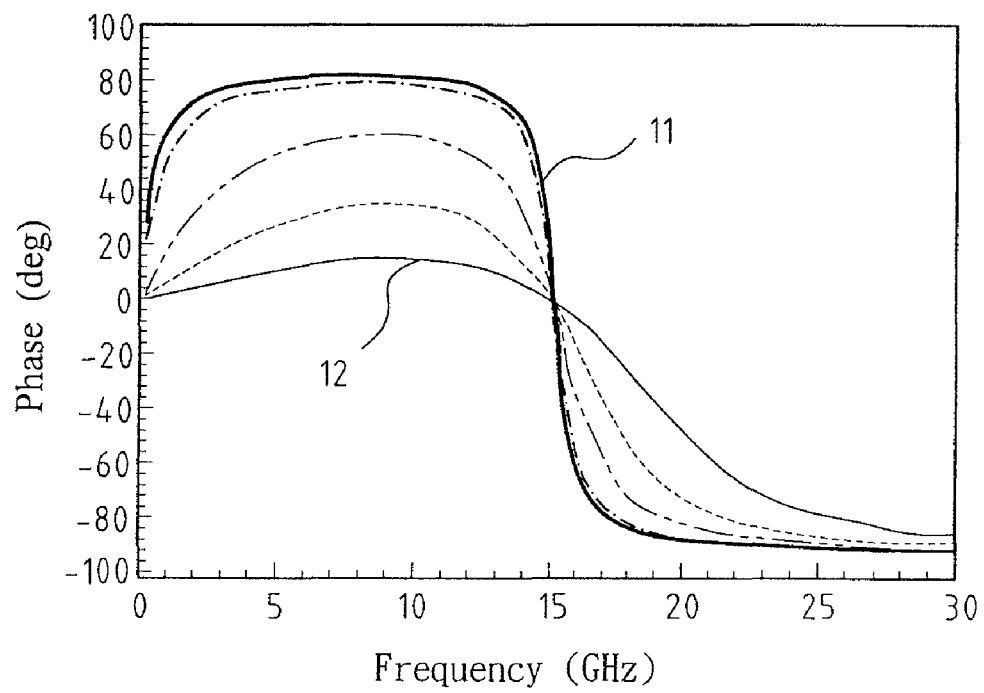
FIG. 1(a) is a Bode diagram of an LC resonant tank of an injection-locked frequency divider (ILFD)

Decreasing the quality factor will cause frequency of phase jitter to increase and an oscillatory signal generated by the LC resonant tank (20) to intermittently drift within the frequency domain of the oscillatory signal. With reference to FIG. 1(a), when $\alpha=1$, the slope of an associated phase waveform (11) is greater than a phase waveform (12) when $\alpha=0$. Since $\alpha$ is directly proportional to the quality factor, the method simply adds an external resistance or adjusts an equivalent resistance. Thus, the locking range can be extended.

Figure 1B:
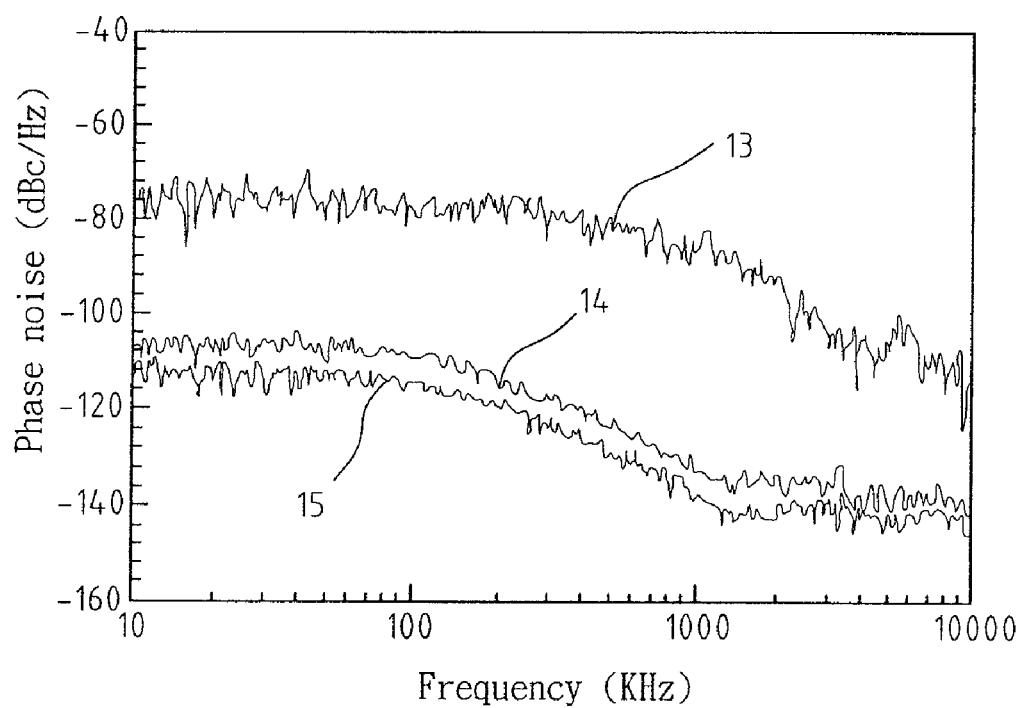
FIG. 1(b) is a graph of phase noise on an injected input signal, ideal input signal and injected locked input signal in the present invention.
Figure 2:
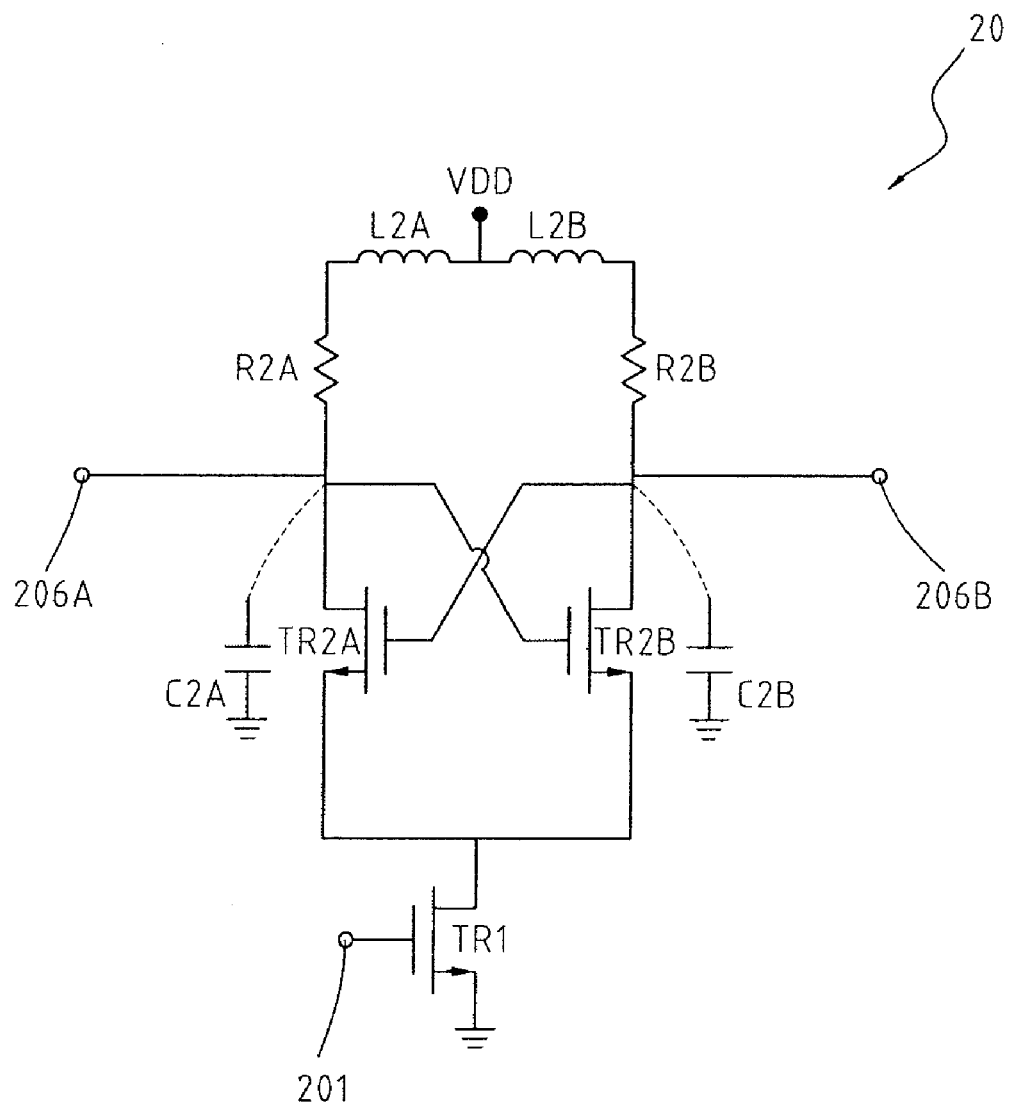
FIG. 2 is a circuit diagram of a divide-by-2 embodiment of an ILFD in accordance with the present invention.
Figure 3:
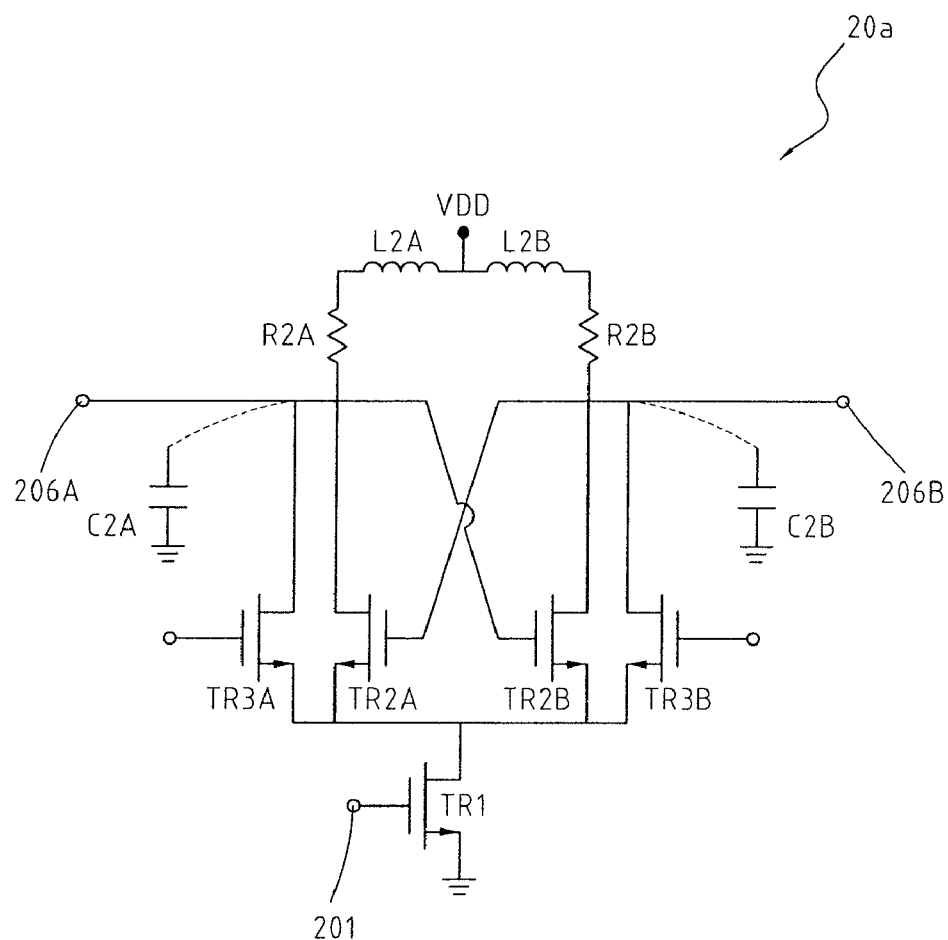
FIG. 3 is a circuit diagram of a first divide-by-3 embodiment of an ILFD in accordance with the present invention.
Figure 4:
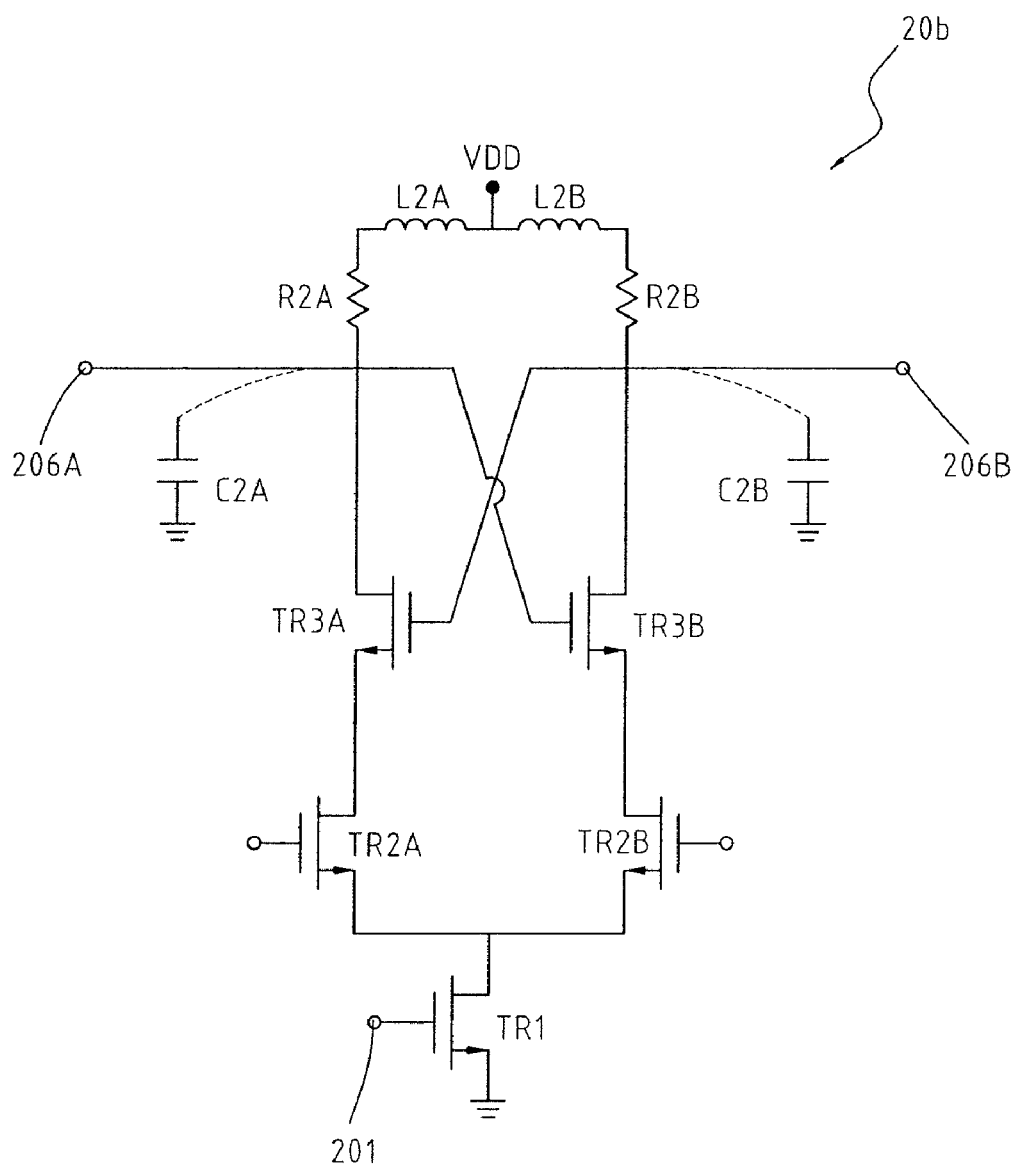
FIG. 4 is a circuit diagram of a second divide-by-3 embodiment of an ILFD in accordance with the present invention.

Notwithstanding that conventional wisdom understands that decreasing the quality factor causes the noise to increase in the ILFD, simulation results (FIG. 1(b)) demonstrate that phase noise of an injected input signal (13) increased by 28 dB compared to the ideal input signal (14). When the input signal (15) is injection locked, the difference in phase noise is only 6 dB. With reference to FIG. 1(b), the simulation results further demonstrate that the ILFD with lower quality factor will behave as an ideal divider when the input signal is injection locked.

What is claimed is:

1. A harmonic suppression circuit comprising:
   a source voltage;
   two suppression modules being connected in parallel to the source voltage, and each suppression module comprising
      an input transistor having
         a drain being connected to the source voltage;
         a source; and
         a gate; and
      two harmonic suppression modules being mounted in series respectively with the input transistors, and each harmonic suppression module comprising
         two smoothing transistors in each harmonic suppression module being mounted in parallel, and each smoothing transistor having
            a drain, the drains being connected respectively to the sources of the input transistors;
            a gate; and
            a source; and
         a resistor being mounted between the gates of the smoothing transistors and having two ends, the end of the resistor connected to the smoothing transistor connected to the opposite suppression module being connected to the drain of the parallel transistor;
   two input terminals being connected respectively to the gates of the input transistors;
   two smoothed output terminals being connected respectively to the sources of the input transistors; and
   a ground being connected to the sources of the smoothing transistors.

2. An injection-locked frequency divider being configured as an LC resonant tank having a resonance frequency ($\omega_0$) and a quality factor ($Q_\alpha$) and comprising
   a ground;
   an input transistor having
      a source being connected to ground;
      a drain; and
      a gate;
   an input terminal being connected to the gate of the input transistor;
   two divider legs being connected in parallel, and each divider leg comprises:
      a divider transistor, the divider transistor having:
         a source being connected to the drain of the input transistor;
         a drain; and
         a gate being connected to the drain of the divider transistor in the other divider leg;
      a resistor being connected to the drain of the divider transistor;
      a parasitic capacitor being connected to ground and to the dividing leg between the resistor; and
      an inductor having two ends, one end is connected to the resistor and other end is connected to the inductor in the other divider leg;
   two output terminals being connected respectively to the divider legs between the resistor and the divider transistor in the opposite divider leg;
   a source voltage; and
   a harmonic suppression circuit comprising
      a source voltage;
      two suppression modules being connected in parallel to the source voltage, and each suppression module comprising
         an input transistor having
            a drain being connected to the source voltage;
            a source; and
            a gate; and
         two harmonic suppression modules being mounted in series respectively with the input transistors, and each harmonic suppression module comprising
            two smoothing transistors in each harmonic suppression module being mounted in parallel, and each smoothing transistor having a drain, the drains being connected respectively to the sources of the input transistors;
a gate; and
a source; and
a resistor being mounted between the gates of the smoothing transistors and having two ends, the end of the resistor connected to the smoothing transistor connected to the opposite suppression module being connected to the drain of the parallel transistor;
two input terminals being connected respectively to the gates of the input transistors;
two smoothed output terminals being connected respectively to the sources of the input transistors; and
a ground being connected to the sources of the smoothing transistors.

3. The injection-locked frequency divider as claimed in claim 2 further comprising
differential transistors being connected respectively to the divider transistors, and each differential transistor comprising
a source;
a drain, and;
a gate; and
differential inputs connected to the gates of the differential transistors.

4. The injection-locked frequency divider as claimed in claim 2, the resistor is a parasitic series resistor.

5. The injection-locked frequency divider as claimed in claim 2, the resistor is a poly resistor.

6. The injection-locked frequency divider as claimed in claim 2, the resistor and inductor being integrated with a routed sheet resistor to integrate the resistor and the inductor.

7. The injection-locked frequency divider as claimed in claim 2 is a divide-by-2 frequency divider of injection-locked frequency divider.

8. The injection-locked frequency divider as claimed in claim 2 is a divide-by-2 frequency divider of injection-locked frequency divider.

9. The injection-locked frequency divider as claimed in claim 3, wherein the differential transistors are connected in series respectively to the divider transistors.

10. The injection-locked frequency divider as claimed in claim 3, wherein the differential transistors are connected in parallel respectively to the divider transistors.

11. The injection-locked frequency divider as claimed in claim 3 is a divide-by-3 frequency divider of injection-locked frequency divider.

* * * * *